United States Patent [19]

Best et al.

[11] 4,402,060
[45] Aug. 30, 1983

[54] GAP TOLERANT MERGE ELEMENT FOR CONTIGUOUS-DISK BUBBLE DEVICES

[75] Inventors: John S. Best, San Jose; Ian L. Sanders, Sunnyvale, both of Calif.

[73] Assignee: International Business Machines Corporation, Armonk, N.Y.

[21] Appl. No.: 287,337

[22] Filed: Jul. 27, 1981

[51] Int. Cl.³ ............................................. G11C 19/00
[52] U.S. Cl. .................................................... 365/36
[58] Field of Search ........................................ 365/36

[56] References Cited

U.S. PATENT DOCUMENTS

| 4,247,912 | 1/1981 | Cullum, Jr. et al. | 365/36 |
| 4,276,614 | 6/1981 | Nelson et al. | 365/36 |
| 4,283,776 | 8/1981 | Nelson | 365/36 |

OTHER PUBLICATIONS

"Design of Bubble Device Elements Employing Ion-Implanted Propagation Patterns," *Bell System Technical Journal*, vol. 59, pp. 229–257, Feb. 1980.
"Currentless Switch and One-Way Propagation Track for Contiguous-Disk Bubble Devices", *IBM Technical Disclosure Bulletin*, vol. 23, No. 7B, Dec. 1980.

*Primary Examiner*—James W. Moffitt
*Attorney, Agent, or Firm*—Joseph E. Kieninger

[57] ABSTRACT

A gap tolerant merge element for contiguous-disk bubble devices is disclosed. The merge element includes one input track with a tip portion substantially facing the cusp portion of a second input track to form a merge region. An output track is associated with the merge region. In a preferred embodiment, the merge element is passive and does not have a conductor. In another embodiment, the merge element is active and does have a conductor.

7 Claims, 10 Drawing Figures

GAP TOLERANT MERGE ELEMENT FOR CONTIGUOUS-DISK BUBBLE DEVICES

DESCRIPTION

1. Technical Field

This invention relates to contiguous-disk bubble devices and more particularly to a gap tolerant merge element.

2. Background Art

A merge gate in a contiguous-disk bubble device may be used to combine two bubble data streams into a single common stream. For example, a merge gate may be positioned on a track leading to the detector thereby permitting one detector to sense bubbles either from the storage loops or directly from the generator.

A merge gate for ion-implanted contiguous-disk bubble devices has been described by Nelson et al in the Bell System Technical Journal Vol. 59, pages 229–257 (February 1980) and in U.S. Pat. No. 4,276,614 as shown in FIG. 1. When subjected to a counterclockwise in-plane rotational field, the bubbles propagate along the very good propagation input track 12 and the poor propagation input track 14 to merge region 16 and then along good propagation output track 18. This merge gate relies on a tip-to-tip relationship between the two input paths. This merge gate does not have a large gap tolerance, that is, the width of the gap must be close to the diameter of the bubble in order to have a bias field range of 10% or higher.

Keefe and Sanders in IBM Technical Disclosure Bulletin Vol. 23, No. 7B, December 1980, pages 3448 and 3449 describe a one-way propagation track for contiguous-disk bubble devices in which a bubble in a cusp portion on one side of the channel is transferred to the tip portion on the other side of the channel. This only refers to a single channel, however, and does not describe a merge element having two input tracks.

SUMMARY OF THE INVENTION

It is a primary object of this invention to provide an improved merge element for contiguous-disk bubble devices.

It is another object of this invention to provide a gap tolerant merge element.

These and other objects are accomplished with a gap tolerant merge element which includes one input track with a tip portion substantially facing the cusp portion of a second input track to form a merge region. The output track is associated with the merge region. In a preferred embodiment the merge element is passive and does not have a conductor. In another embodiment an active merge element includes a conductor. This gap tolerant merge element permits the gap to be more than twice the diameter of the bubble and still provide a 10% bias field range.

Other objects of this invention will be apparent from the following detailed description, reference being made to the accompanying drawing wherein the specific embodiment of the invention is shown.

DESCRIPTION OF THE PREFERRED EMBODIMENT

Figure 2A:
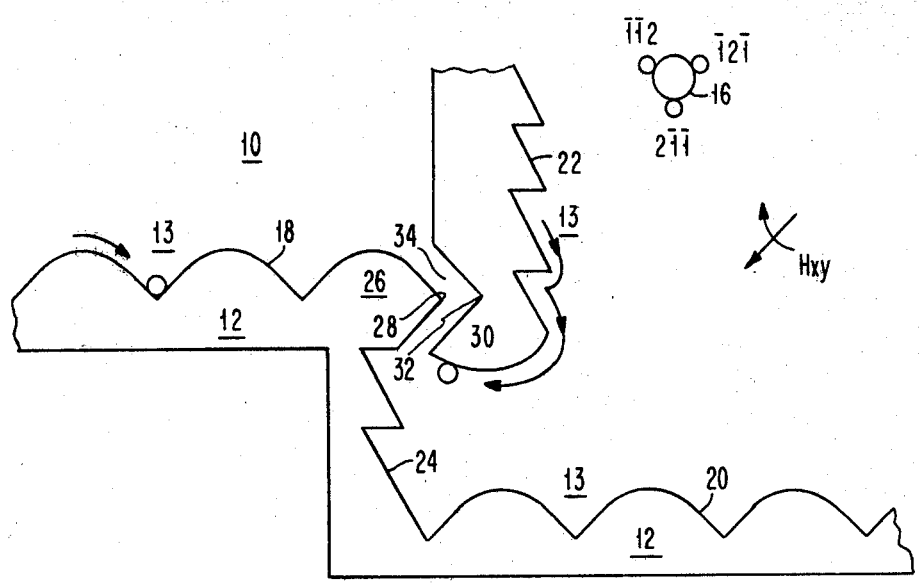
FIGS. 2A–2D are top views of a passive merge element showing clockwise bubble rotation in accordance with this invention.

As shown in FIG. 2A, a merge element 10 contains two non ion-implanted regions 12 and 14 surrounded by an ion-implanted region 13 in the bubble domain supporting material (not shown) having the crystallographic orientation 16. The crystallographic orientation 16 results in input track 18 and output track portion 20 being very good propagation tracks, that is, bubbles propagate very smoothly along such tracks with large operating margins. Input track 22 and output track portion 24 are good propagation tracks, that is, bubbles propagate in the direction of these tracks fairly smoothly with satisfactory operating margins, but the propagation characteristics are not as good as those of tracks 18 and 20.

The track 18 on non-implanted region 12 has a tip portion 26 that leads to output track portions 24 and 20. The tip portion 26 has an end 28. The track 22 on non-implanted region 14 goes to a cusp 30. Cusp 30 has a bottom 32. The tip portion 26 is separated from the cusp 30 by a gap 34, an ion-implanted region. A cusp is defined as a non ion-implanted region having a concave surface that is adjacent to an ion-implanted region having a convex configuration. A tip is defined as a non ion-implanted region having a convex surface that is adjacent to an ion-implanted region having a concave surface.

Figure 1:
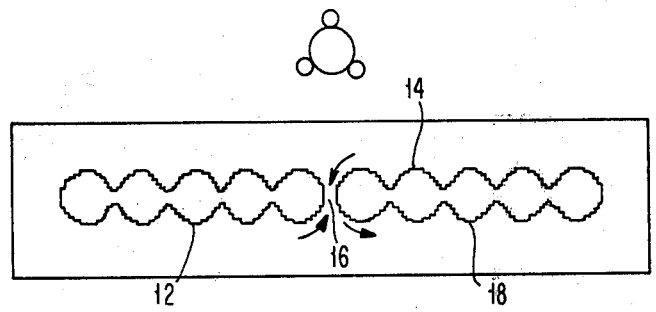
FIG. 1 is a top view of a prior art merge element.

Merging of two bubble data streams in the merge element 10 takes place between the tip 28 and the bottom of the cusp 32. The operation of the merge element is tolerant to the distance or gap between the tip 28 and the bottom of the cusp 32. The gap can be at least as wide as 2.3 times the diameter of the bubble and still operate over a bias field range of 10%. A bias field range of 10% or more is desirable for operation of a component in a magnetic bubble device. Smaller gap sizes would result in larger bias field ranges. For example, a gap of 1.7 times the diameter of the bubble provides a 12% bias field range. In comparison, the bias field range provided by the prior art merge gate shown in FIG. 1 is 5% for a gap of 1.7 times the diameter of the bubble. The gap of the prior art merge gate must be substantially the same size as the actual bubble diameter in order to provide a satisfactory bias field range. The merge element 10 of FIG. 2A can therefore be operated with a wider gap and is less sensitive to gap size variations than the prior art merge gate of FIG. 1. This gap tolerance becomes very important as the size of the bubbles and elements are reduced to increase the storage density of contiguous-disk bubble devices.

The merge element 10 works in the following manner. A bubble on propagation track 18 proceeds along track 18 in a direction from left to right with the application of a clockwise rotational in-plane field past tip 28 to output track portion 24 to track output portion 20.

Figures 2B, 2C, 2D:
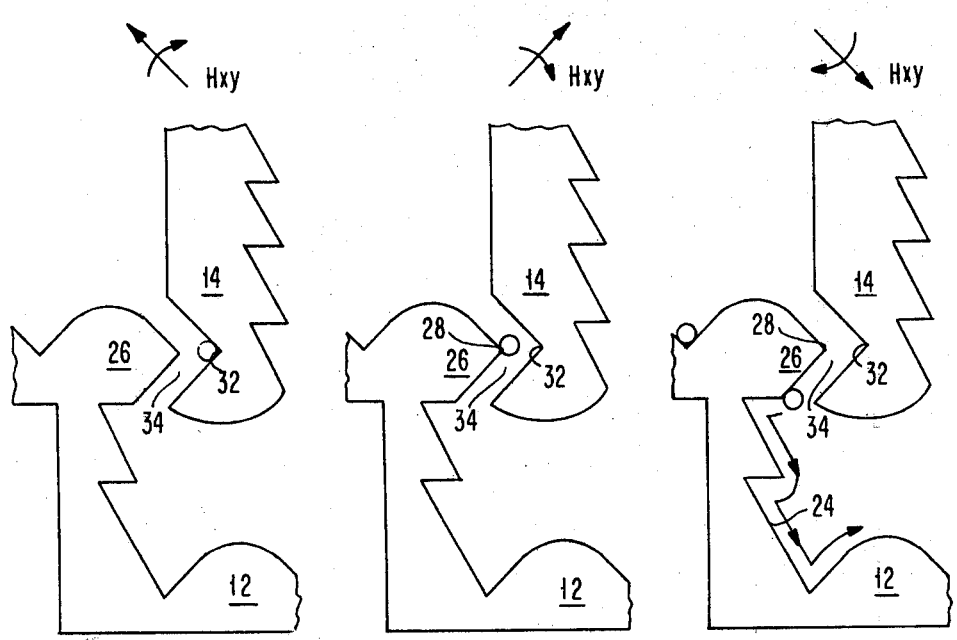

A bubble propagating along track 22 will proceed down the pattern 14 to the end near the cusp 30. As shown in FIGS. 2B through 2D, as the magnetic in-plane field is rotated in a clockwise direction, the bubble will propagate to the bottom 32 of cusp 30 (FIG. 2B)

across the gap 34 to the tip 28 (FIG. 2C) and then down the side of tip portion 26 to the output track portion 24 (FIG. 2D). The structure shown in FIG. 2 is a passive merge element, that is, it does not require a current-carrying conductor.

Figure 3:
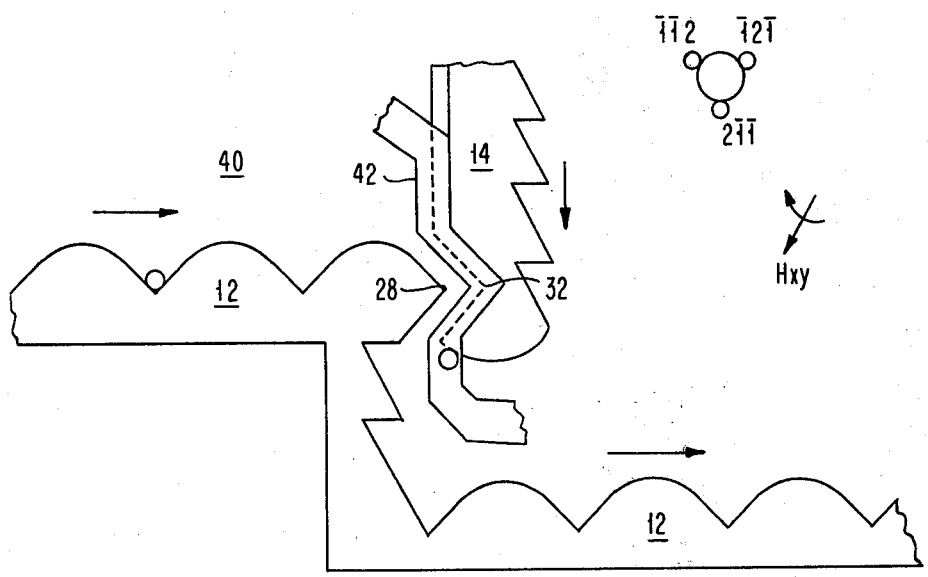
FIG. 3 is a top view of an active merge element for use with clockwise bubble rotation in accordance with this invention.

FIG. 3 is an active merge element 40 for use with counter-clockwise bubble rotation since it contains a conductor 42 positioned along the edge of the pattern 14. By activating the conductor 42 at the appropriate time, the propagation of the bubble from the bottom of the cusp 32 to the tip 28 is enhanced.

Figure 4A:
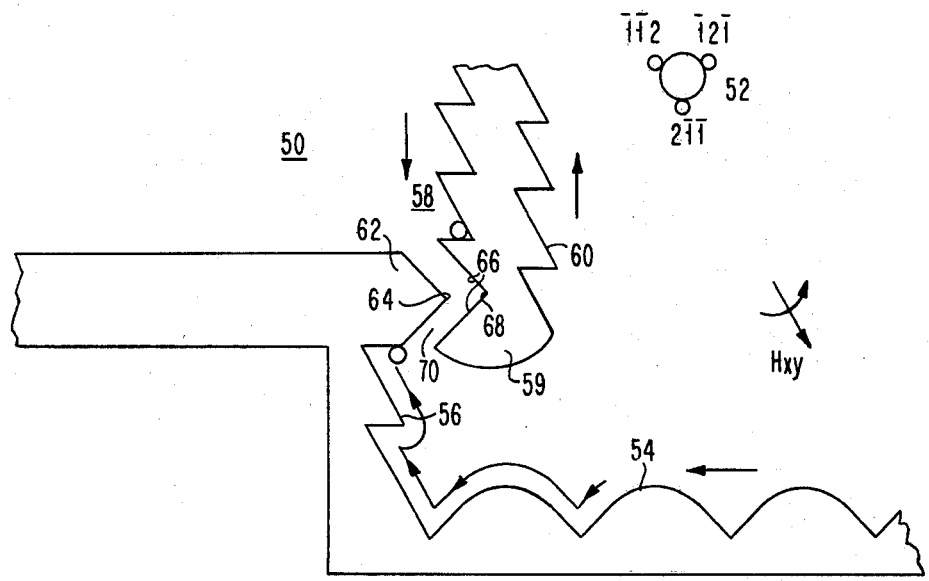
FIGS. 4A–4D are top views of a passive merge element showing counter-clockwise bubble rotation in accordance with this invention.

While the embodiment shown in FIG. 2A is suitable for use with a clockwise rotational magnetic field, the merge element 50 shown in FIG. 4A is suitable for use with a counterclockwise rotational magnetic field.

The bubble domain supporting material (not shown) has the crystallographic orientation 52. The crystallographic orientation 52 results in the input track portion 54 being a very good propagation track and input track portion 56, input track 58 and output track 60 being good propagation tracks. The input track portion 56 has a tip portion 62 with and end 64. The input track 58 goes to cusp 66. Cusp 66 has a bottom 68. The tip portion 62 is separated from the cusp 66 by a gap 70.

Figures 4B, 4C, 4D:
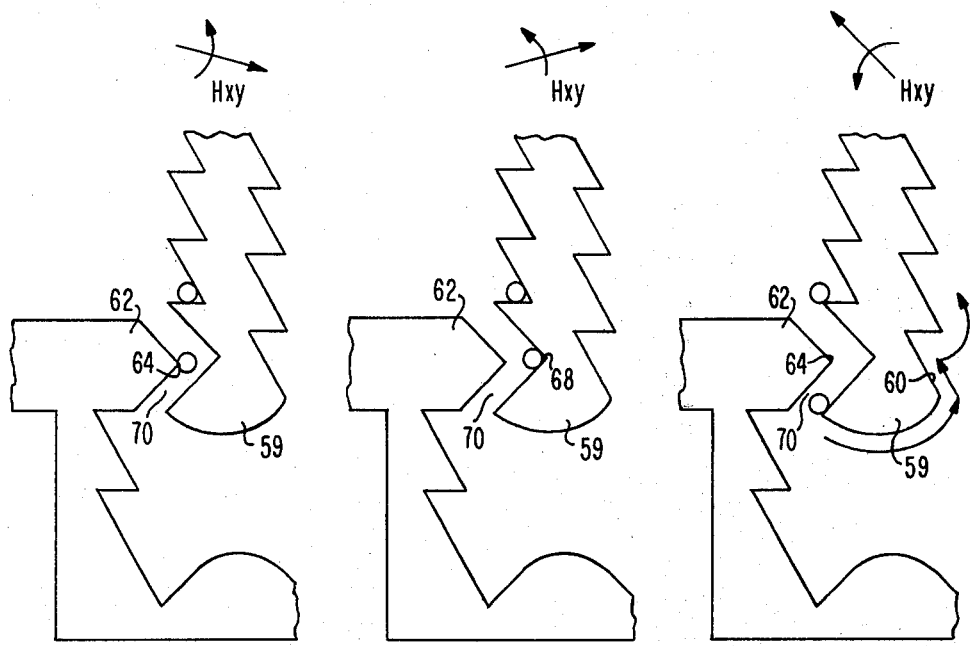

Merging in the merge element 50 takes place between the tip 64 and the bottom of the cusp 68. The merge element 50 works in the following manner. A bubble propagating along input track 58 will proceed down the pattern past the cusp 66 to the end 59 of the pattern and up the output track 60. A bubble propagating along input track portion 54 will proceed in a direction from right to left with the application of a counterclockwise rotational in-plane field to input track portion 56 and to tip 64 as shown in FIG. 4B. The bubble will propagate across the gap 70 to the bottom of the cusp 68 (FIG. 4C) and then around the end 59 to output track 60 (FIG. 4D). The structure shown in FIG. 4A is a passive merge element, that is, it does not include a conductor.

Although a preferred embodiment of this invention has been described, it is understood that numerous variations may be made in accordance with the principles of this invention.

What is claimed is:

1. A merge element for ion-implanted bubble devices comprising
    bubble domain supporting material having ion-implanted and non ion-implanted regions, said material having three crystallographic axes of symmetry in the plane of the material,
    a first input track with a tip portion,
    a second input track with a cusp portion substantially facing said tip portion to form a gap therebetween adapted to be a merge region, said cusp portion oriented such that a line bisecting the angle making said cusp is perpendicular to one of said three axes, said cusp portion having edges that are substantially parallel to said tip portion, and
    an output track associated with said merge region wherein bubbles from said first and said second input tracks merge and propagate on said output track.

2. A merge element as described in claim 1 wherein said output track is contiguous with said first input track.

3. A merge element as described in claim 1 wherein said output track is contiguous with said second input track.

4. A merge element as described in claim 1 wherein said input tract having a tip portion is substantially perpendicular to the second input track.

5. A merge element as described in claim 1 including a conductor overlapping said second input track.

6. A merge element as described in claim 1 wherein said bubble domain supporting material has a crystallographic orientation such that said first input track is a very good propagation track.

7. A merge element as described in claim 1 wherein said bubble domain supporting material has a crystallographic orientation such that said second input track is a good propagation track.

* * * * *